United States Patent
Knapp et al.

(10) Patent No.: US 12,381,531 B2
(45) Date of Patent: Aug. 5, 2025

(54) THIN-FILM LITAO$_3$ SAW RESONATOR ON SILICON SUBSTRATE WITH REDUCED SPURIOUS MODES

(71) Applicant: RF360 SINGAPORE PTE. LTD., Republic Plaza (SG)

(72) Inventors: Matthias Knapp, Munich (DE); Manuel Sabbagh, Dorfen (DE); Gholamreza Dadgar Javid, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 884 days.

(21) Appl. No.: 17/597,468

(22) PCT Filed: Jun. 25, 2020

(86) PCT No.: PCT/EP2020/067845
§ 371 (c)(1),
(2) Date: Jan. 6, 2022

(87) PCT Pub. No.: WO2021/008847
PCT Pub. Date: Jan. 21, 2021

(65) Prior Publication Data
US 2022/0173714 A1 Jun. 2, 2022

(30) Foreign Application Priority Data
Jul. 15, 2019 (DE) .................. 10 2019 119 097.5

(51) Int. Cl.
*H03H 9/02* (2006.01)
*H03H 9/145* (2006.01)
(Continued)

(52) U.S. Cl.
CPC .... *H03H 9/02574* (2013.01); *H03H 9/02559* (2013.01); *H03H 9/145* (2013.01);
(Continued)

(58) Field of Classification Search
CPC .......... H03H 9/02574; H03H 9/02559; H03H 9/145; H03H 9/25
(Continued)

(56) References Cited

U.S. PATENT DOCUMENTS

2014/0152145 A1* 6/2014 Kando ............... H03H 9/02574
29/25.35
2017/0033764 A1 2/2017 Inoue et al.
(Continued)

FOREIGN PATENT DOCUMENTS

| WO | 2018151147 A1 | 8/2018 |
| WO | 2018163842 A1 | 9/2018 |
| WO | 2018215152 | 11/2018 |

OTHER PUBLICATIONS

International Search Report and Written Opinion—PCT/EP2020/067845—ISA/EPO—Aug. 5, 2020.

*Primary Examiner* — Derek J Rosenau
(74) *Attorney, Agent, or Firm* — Polsinelli

(57) ABSTRACT

A SAW resonator with reduced spurious modes is provided. The resonator comprises a (111) silicon carrier substrate (CS), an electrode structure (ES) and a piezoelectric layer (PIL). The carrier substrate has a crystal orientation with the Euler angles (−45°±10°; −54°±10°; 60°±30°) and the piezoelectric layer comprises LiTaO$_3$ and has a crystal orientation with the Euler angles (0°; 56°±8°; 0°). There may be intermediate layers (IL1, IL2) of SiO$_2$ and amorphous or polycrystalline materials. In addition a silicon nitride layer is provided as passivation (PAL). Electrodes are made of aluminum. Thicknesses of all layers are selected in particular ranges to optimize SAW behaviour.

11 Claims, 6 Drawing Sheets

(51) Int. Cl.
*H03H 9/25* (2006.01)
*H03H 9/64* (2006.01)
*H03H 9/72* (2006.01)

(52) U.S. Cl.
CPC .............. *H03H 9/25* (2013.01); *H03H 9/6483* (2013.01); *H03H 9/725* (2013.01)

(58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2019/0149125 A1* | 5/2019 | Saji .................... H03H 9/02858 310/313 B |
| 2019/0393858 A1 | 12/2019 | Iwamoto et al. |
| 2020/0028486 A1 | 1/2020 | Kishino et al. |
| 2020/0144981 A1 | 5/2020 | Knapp et al. |

* cited by examiner

THIN-FILM LITAO₃ SAW RESONATOR ON SILICON SUBSTRATE WITH REDUCED SPURIOUS MODES

The present application refers to electro acoustic resonators that can be used in carrier aggregation (CA) applications and that have reduced spurious modes.

The ongoing trend towards a higher number of functionalities, larger data transmission rates and smaller spatial dimensions demands for improved devices for mobile communication and for improved components for such devices. The evolution of next generation mobile communication systems requires devices with outstanding performance.

In electro acoustic resonators an electrode structure in combination with a piezoelectric material convert—due to the piezoelectric effect—between electromagnetic and acoustic RF signals. However, in real devices unwanted, spurious modes may be excited in addition to wanted acoustic modes. The unwanted, spurious acoustic modes deteriorate the corresponding filter's performance, making it difficult or impossible for conventional resonators to comply with present or future specifications.

From U.S. Pat. No. 9,190,981B2 and from U.S. Pat. No. 9,413,334B2 layer constructions for electro acoustic resonators are known.

From US 2015/0102705 A1 electro acoustic resonators comprising dielectric functional layers are known.

From DE 102017111448 $A_1$ the use of a silicon material as a carrier substrate is known.

However, conventional electro acoustic resonators, e.g. SAW resonators (SAW=surface acoustic wave) comprise additional functional layers, e.g. for temperature compensation, for passivation and the like that facilitate the creation of unwanted, spurious modes.

Thus, what is wanted is an electro acoustic resonator that enables RF filters, e.g. for mobile communication applications, having outstanding performance, having a well matched (not too high and not too low) electro acoustic coupling coefficient $\kappa^2$, having a low temperature coefficient of frequency (TCF), that are compatible with carrier aggregation applications, in which other performance parameters are not deteriorated, that comply with stringent specifications, that can be used with different frequency ranges and that have a reduced strength of unwanted, spurious modes such as higher order modes or bulk modes.

To that end, a SAW resonator according to independent claim 1 is provided. Dependent claims provide preferred embodiments.

The SAW resonator comprises a carrier substrate, an electrode structure above the carrier substrate and a piezoelectric layer between the carrier substrate and the electrode structure. The carrier substrate has a crystal orientation with the Euler angles (−45°±10°; 54°±10°; 60°±30°). The piezoelectric layer comprises Lithium Tantalate (LiTaO₃) and has a crystal orientation with the Euler angles (0°; 56°±8°; 0°).

In SAW resonators a wanted acoustic mode is excited by the electrode structure in combination with the piezoelectric material utilizing the piezoelectric effect. The electrode structure usually has interdigitated comb-like electrodes comprising two busbars and electrode fingers that are electrically connected to one of the two busbars. The wanted acoustic mode typically propagates in the longitudinal direction x, a direction perpendicular to the extension of the electrode fingers (which extend along the transversal direction y) at the surface of the piezoelectric material.

Additional acoustic modes (spurious modes) can be excited as a result of, for example, non-linear effects of the piezoelectric material or by reflection effects within the corresponding waveguiding structure for the wanted acoustic mode. Especially components of the resonators that may be needed for complying with specific requirements, e.g. TCF layers and the like, can establish another source of excitation of unwanted modes. Thus, in conventional resonators spurious modes must be accepted as an unavoidable side effect.

The separation of a spurious mode from a wanted acoustic mode by the SAW resonator as described above removes the spurious mode at least partially such that detrimental effects are reduced and the performance of the resonator and the corresponding filter is improved.

Spurious modes can occur at frequency ranges that are sufficiently far away from the working frequencies of the resonator. However, when carrier aggregation systems are concerned then such spurious modes can disturb the operation of another frequency band. Thus, while such spurious modes may have been tolerated in systems without carrier aggregation, in new systems supporting carrier aggregation such modes cannot be accepted any longer and the above-described separation allows the present resonators to be used in carrier aggregation systems.

The decoupling of wanted from unwanted modes keeps the wanted acoustic energy in the acoustic track while the (reduced) energy of unwanted acoustic modes can dissipate in the bulk material.

Further, the materials and the material system and the layer arrangement can be chosen such that the excitation of wanted modes is enhanced while the excitation of unwanted modes is reduced.

The parameters of the materials of the corresponding layer construction of the resonator are chosen such that the above effects are obtained. For example by choosing the stiffness constants, the lattice constants and the lattice orientation of the layers, the above-described effects can be obtained.

By providing the Euler angles, the orientation of the crystallographic axes relative to the top surface of the carrier substrate is also unambiguously clear. Additionally, the propagation direction of the acoustic wave mode relative to the crystallographic axes is also unambiguously defined by the Euler angles.

In this case, the Euler angles ($\lambda'$, $\mu$, $\theta$) are defined as follows: firstly, a set of axes x, y, z are taken as a basis, which are the crystallographic axes of the piezoelectric material.

The first angle, $\lambda'$, specifies by what magnitude the x-axis and the y-axis are rotated about the z-axis, the x-axis being rotated in the direction of the y-axis. A new set of axes x', y', z' correspondingly arises, wherein z=z'.

In a further rotation, the z'-axis and y'-axis are rotated about the x'-axis by the angle $\mu$. In this case, the y'-axis is rotated in the direction of the z'-axis. A new set of axes x", y", z" correspondingly arises, wherein x'=x".

In a third rotation, the x"-axis and the y"-axis are rotated about the z"-axis by the angle $\theta$. In this case, the x"-axis is rotated in the direction of the y"-axis. A third set of axes x''', y''', z''' thus arises, wherein z"=z'''.

In this case, the x'''-axis and the y'''-axis are parallel to the surface of the substrate. The z'''-axis is the normal to the surface of the substrate. The x'''-axis specifies the propagation direction of the acoustic waves.

The definition is in accordance with the International Standard IEC 62276, 2005-05, Annex A1.

It is specifically possible that the carrier substrate has the Euler angles (−45°±5°; −54°±5°; 60°±10°) or (−45°±2°; −54°±5°; 60°±5°) or (−45°; −54°; 60°).

Also, it is specifically possible that the piezoelectric layer has a crystal orientation with the Euler angles (0°; 56°±4°; 0°, (0°; 56°±2°; 0°) or (0°; 56°; 0°).

It is possible that the SAW resonator additionally comprises a first intermediate layer. The first intermediate layer can be arranged between the carrier substrate and the piezoelectric layer. The first intermediate layer can have a thickness $t_{IL1}$ with $0.05\lambda \leq t_{IL1} \leq \lambda$. In the context of the present SAW resonator $\lambda$ is the wavelength of the acoustic main mode propagating at the surface of the piezoelectric material along the longitudinal direction x.

It is possible that the first intermediate layer comprises or consists of a material selected from polycrystalline silicon (Si), an amorphous material, a dielectric material.

Further, it is possible that the SAW resonator comprises a second intermediate layer. The second intermediate layer can be arranged between the carrier substrate and the piezoelectric layer. The second intermediate layer can have a thickness $t_{IL2}$ with $0.05\lambda \leq t_{IL2} \leq 0.25\lambda$.

It is possible that the second intermediate layer comprises or consists of a material selected from a silicon oxide and silicon dioxide ($SiO_2$).

It is possible that the SAW resonator comprises the first intermediate layer but not the second intermediate layer.

However, it is also possible that the SAW resonator comprises the second intermediate layer but not the first intermediate layer.

It is also possible that the SAW resonator comprises the first intermediate layer and the second intermediate layer.

When the SAW resonator comprises both the first and the second intermediate layer then the first intermediate layer can be arranged between the second intermediate layer and the piezoelectric layer. However, it may be preferred that the first intermediate layer is arranged between the carrier substrate and the second intermediate.

The first, the second and the combination of both intermediate layers can provide the above mentioned wave guiding structure that helps not exciting unwanted modes, suppressing unwanted modes and/or separating unwanted modes from the wanted main mode.

It is possible that the piezoelectric layer has a thickness $t_{PIL}$ with $0.1\lambda \leq t_{PIL} \leq 0.3$.

It is possible that the electrode structure comprises or consists of aluminium (Al) and has a thickness $t_{EL}$ with $0.05\lambda \leq t_{EL} \leq 0.2\lambda$.

It is possible that the SAW resonator further comprises a passivation layer. The passivation layer can be arranged on or above the electrode structure. The passivation layer can comprise silicon nitride ($Si_3N_4$) and have a thickness $t_{PAL}$ with $0.0025\lambda \leq t_{PAL} \leq 0.05\lambda$.

It is also possible that the SAW resonator is a resonator in an electroacoustic filter. Thus, an electro acoustic filter can comprise a SAW resonator as described above.

Specifically, it is possible that two or more or each SAW resonator of the filter is of a type as described above.

The filter can have a ladder type like circuit topology with series resonators electrically connected in series in a signal path and with parallel resonators arranged in parallel paths coupling the signal path to a ground potential.

Also, it is possible that the filter can have a lattice type like circuit topology with at least one resonator electrically coupling a first connection of a first port to a second connection of a second port.

Such filters comply with the CA requirements because even unwanted modes that would not be detrimental in filters for not CA applications because their characteristic frequencies are sufficiently far from characteristic frequencies of the filter can be suppresses or eliminated.

Correspondingly, it is possible that such a filter is arranged in a Multiplexer, e.g. for CA applications. Thus, a multiplexer, e.g. for CA applications, can comprise a filter as described above.

Specifically, it is possible that two or more or each filter is of a type as described above.

The specific properties of the resonator as described above has an intrinsic compensation of negative effects of conventional means for suppressing unwanted modes such that the need for additional circuit components, e.g. for impedance matching is substantially decreased.

Specifically, a too strong increase of the electro acoustic coupling coefficient is prevented. In particular, this positive effect can be obtained by the specific angles, materials and layer thicknesses.

The reduced need for additional matching elements also manifests in an improved (i.e. increased) flank steepness of corresponding band pass filters or band rejection filters.

Central aspects of the SAW resonator and details of preferred embodiments are shown in the accompanying schematic figures.

IN THE FIGURES

Figure 6:
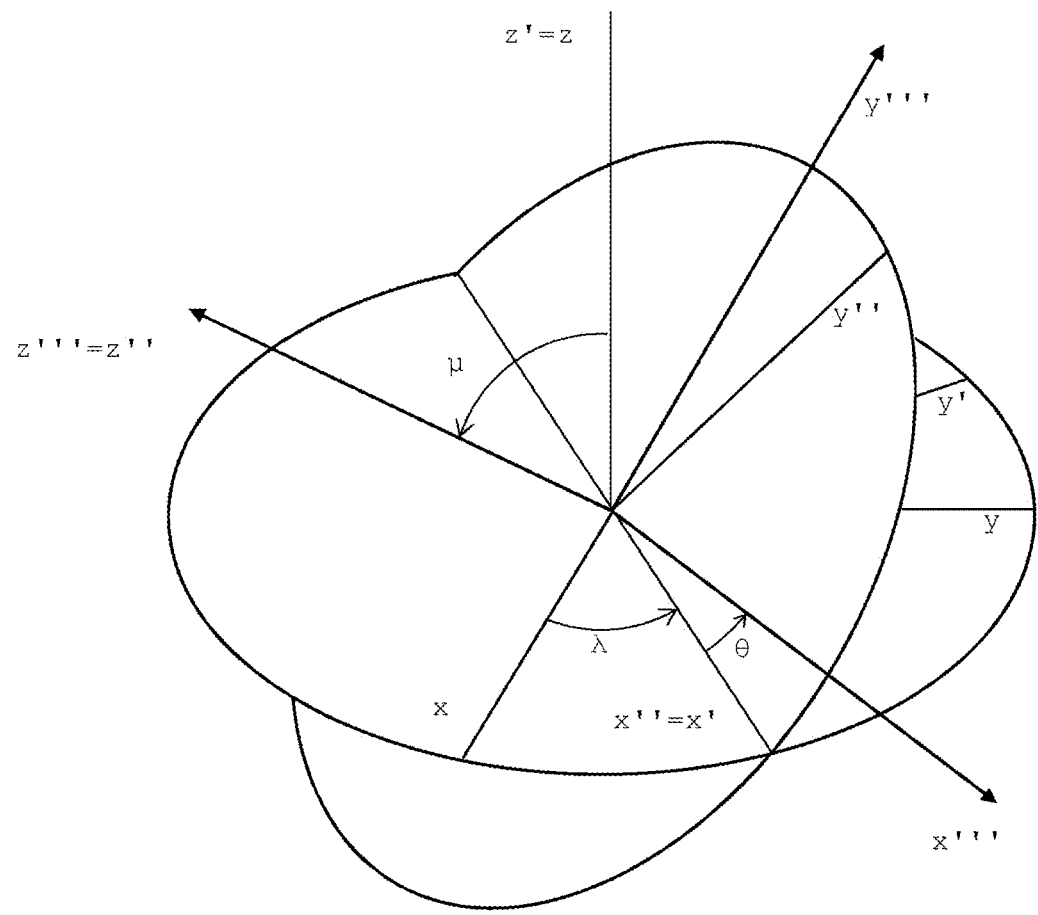
Figure 7:
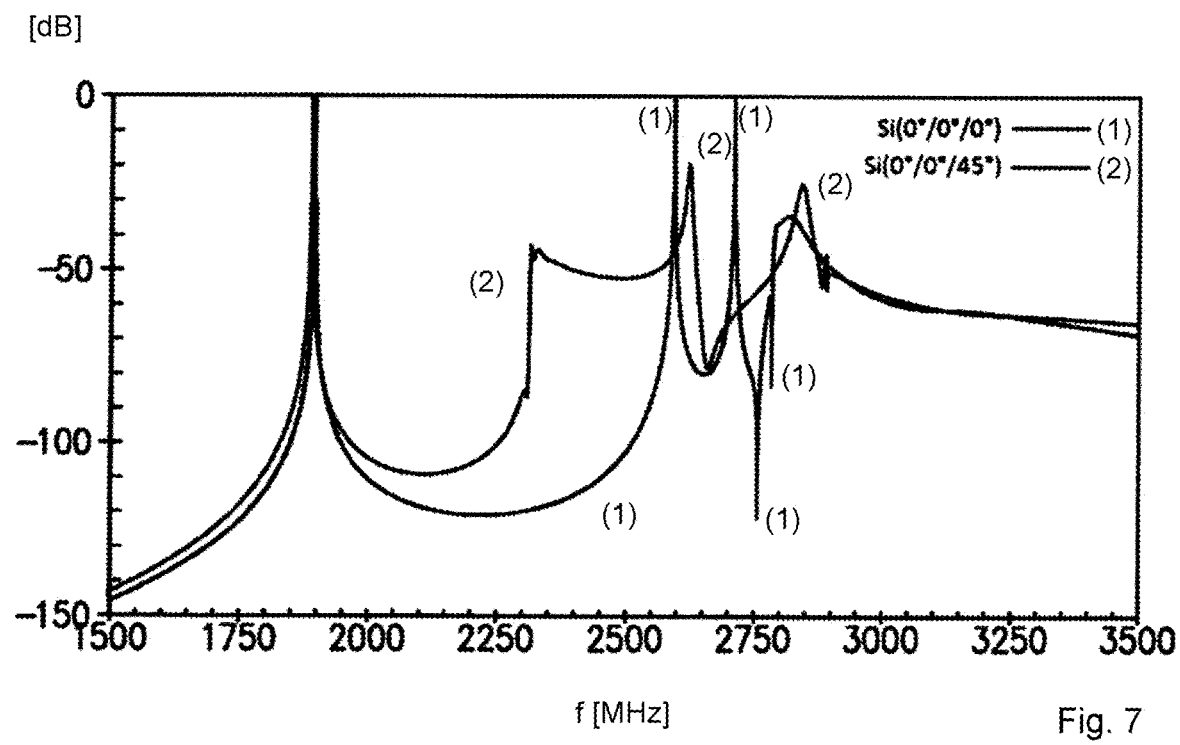
Figure 8:
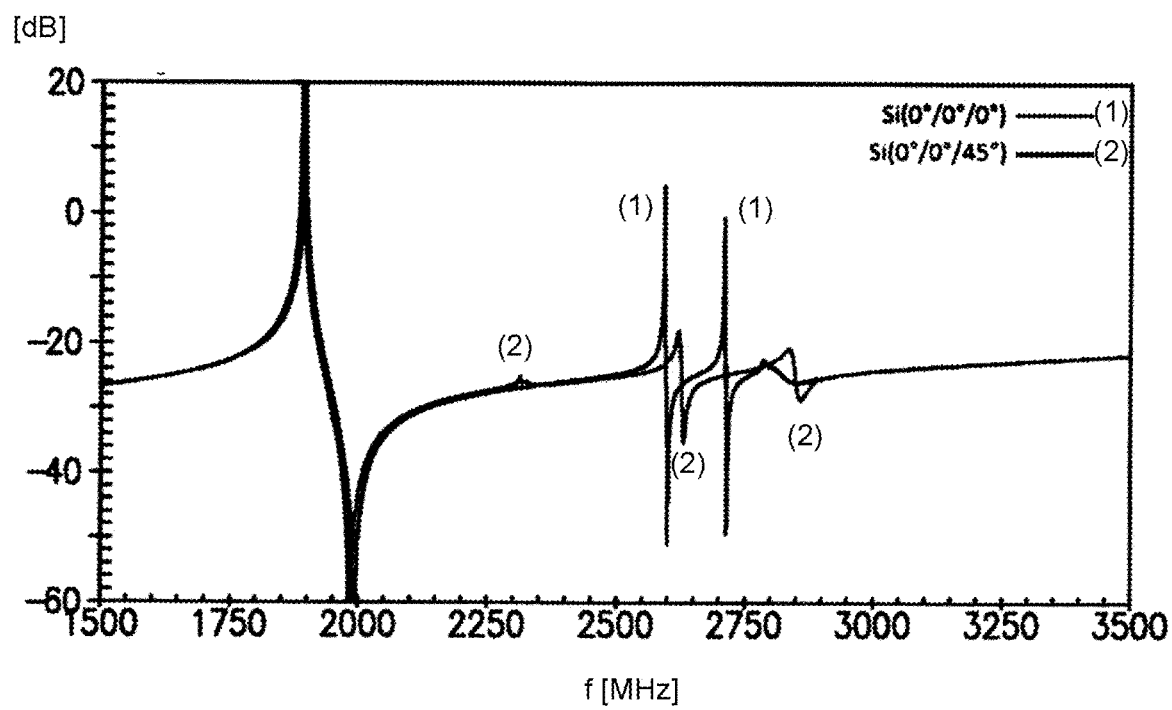
Figure 9:
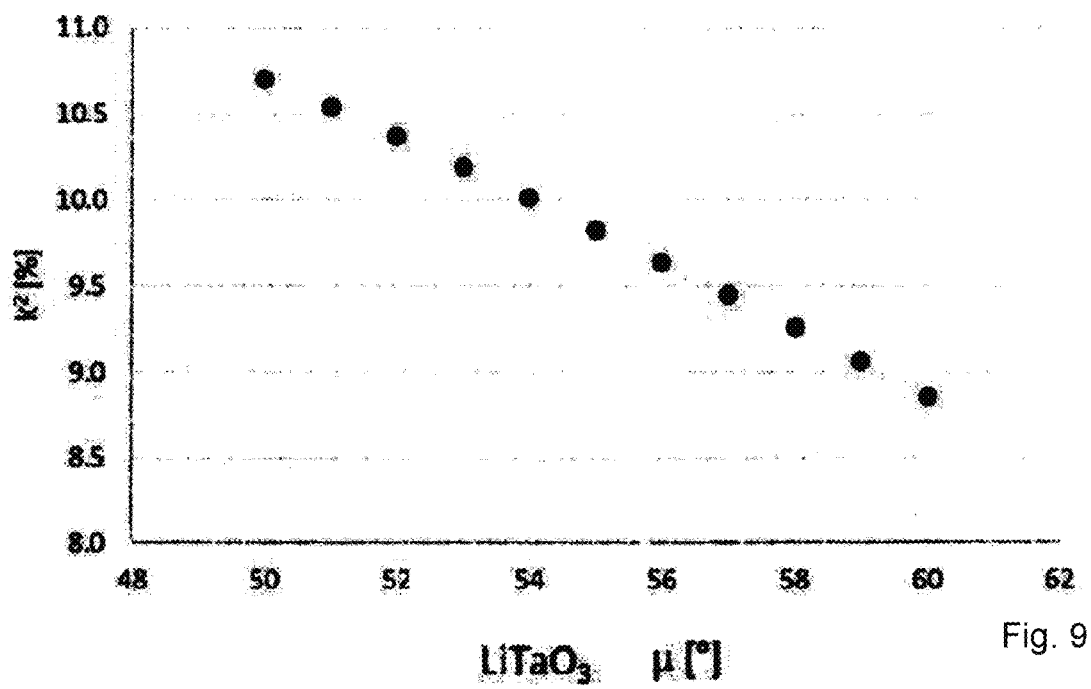
Figure 10:
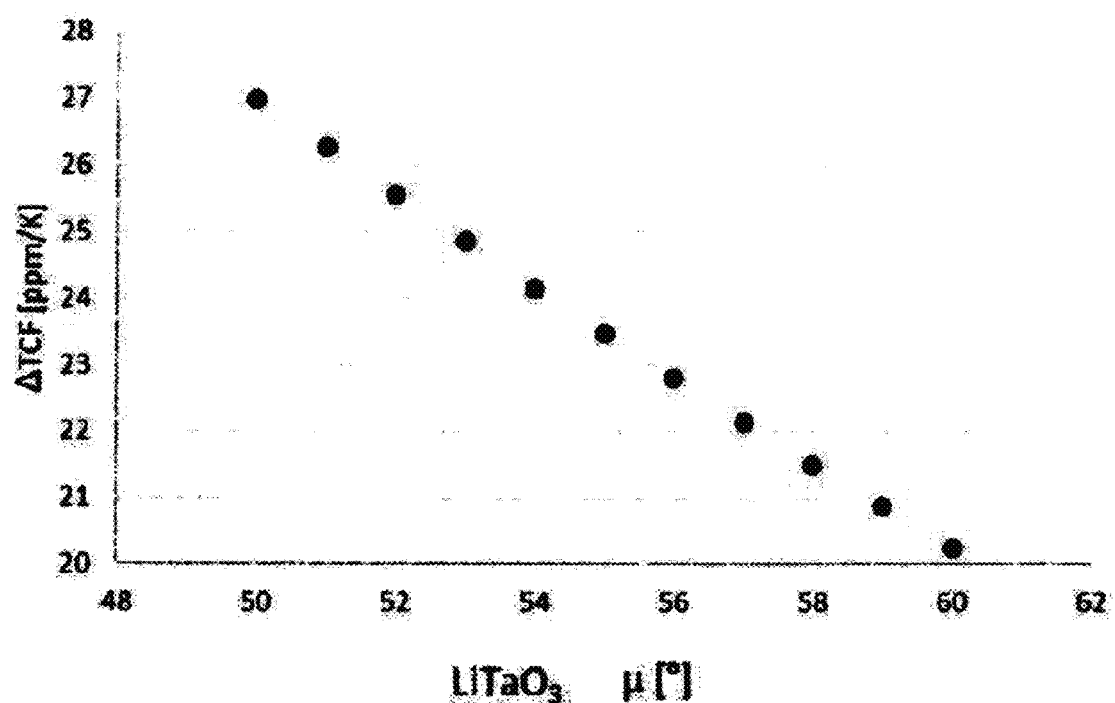
Figure 11:
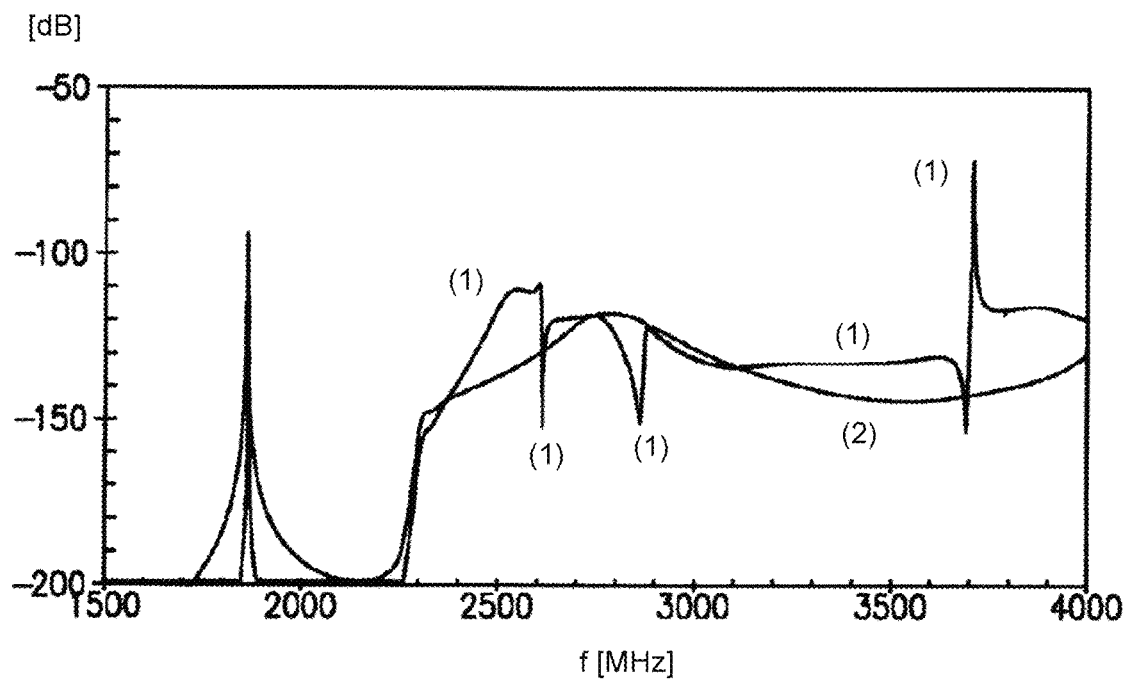
Figure 12:
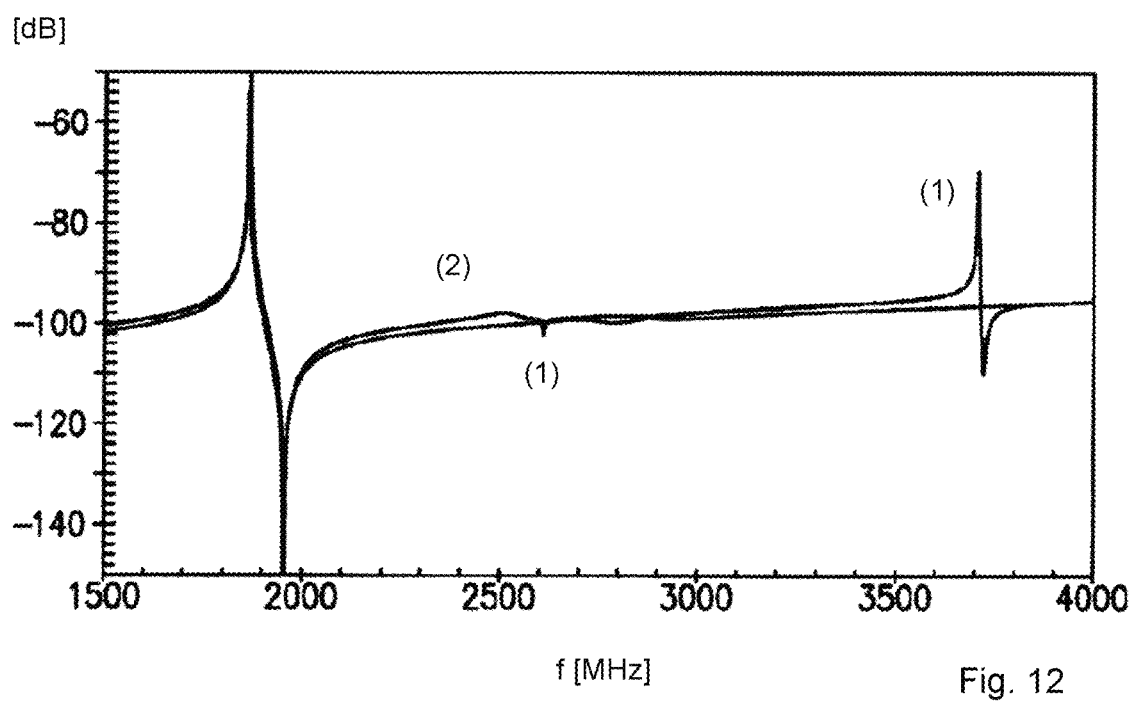

FIG. 6 indicates the definition of the Euler angles;

FIG. 7 shows the real paths of admittance curves for different Euler angles of the carrier substrate (frequency-dependent);

FIG. 8 shows the corresponding magnitude values;

FIG. 9 shows the Euler angle μ dependence of the electroacoustic coupling coefficient $\kappa^2$ for $LiTaO_3$;

FIG. 10 shows the Euler angle μ dependence of the temperature induced frequency drift ΔTCF for $LiTaO_3$;

FIG. 11 shows the real parts of the frequency dependent admittances of a conventional resonator and of a resonator as described above;

FIG. 12 shows magnitudes of the frequency dependent admittances of the conventional resonator and of the resonator as described.

Figure 1:
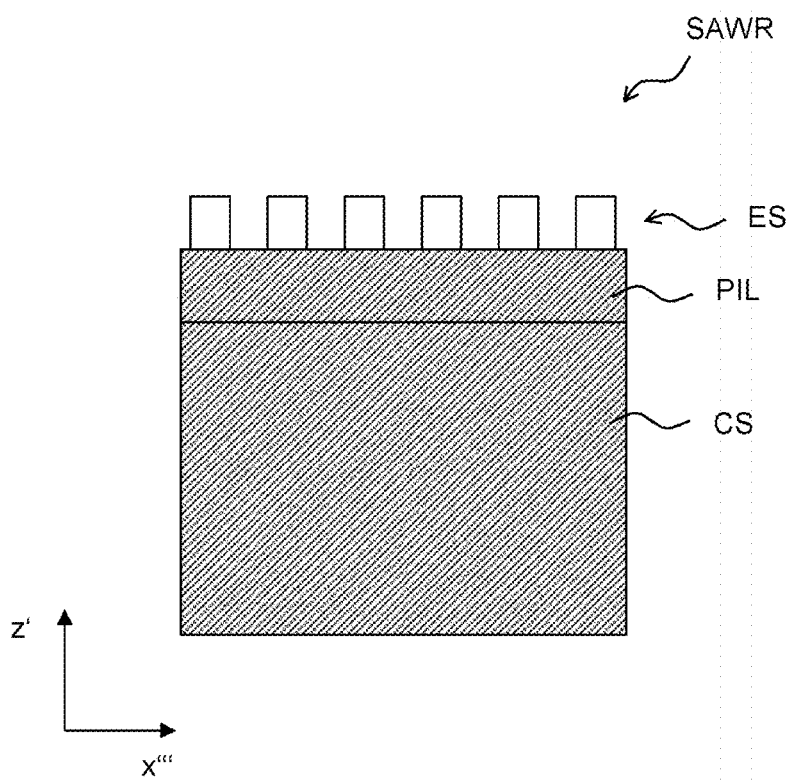
FIG. 1 shows a cross-section through a possible layer construction.

FIG. 1 illustrates a cross-section view through the x'''-z'-plane of a possible layer construction of the SAW resonator SAWR. The layer construction comprises a carrier substrate CS on which further layer elements are arranged. Especially the electrode structure ES is arranged above the carrier substrate CS. Between the carrier substrate CS and the electrode structure ES the piezoelectric layer PIL comprising or consisting of a piezoelectric material is arranged. The specifically chosen Euler angles in combination with the two materials establish an interface that can work as a wave mode separator. The layer construction has its layers arranged on one another in the vertical direction (z'). The electrode structure ES has electrode fingers of which the cross-section is shown in FIG. 1. The extension of the electrode fingers is orthogonal to the x'''-z'-plane defining the cross-section shown in FIG. 1 and along the transversal direction y'''.

Figure 2:
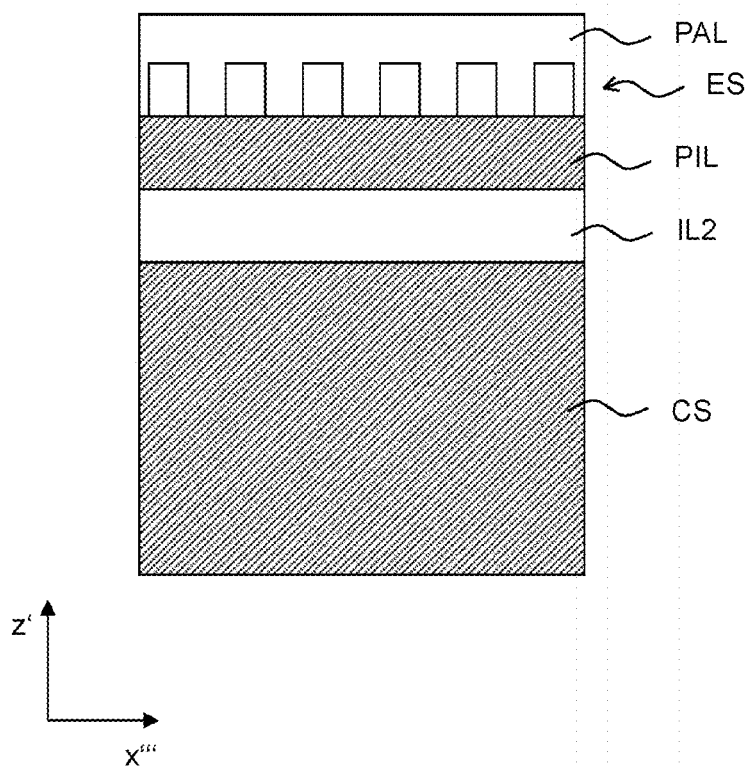
FIG. 2 shows a layer construction comprising a first separation layer.

Further, FIG. 2 illustrates a possible layer construction including the second intermediate layer $IL_2$.

Figure 3:
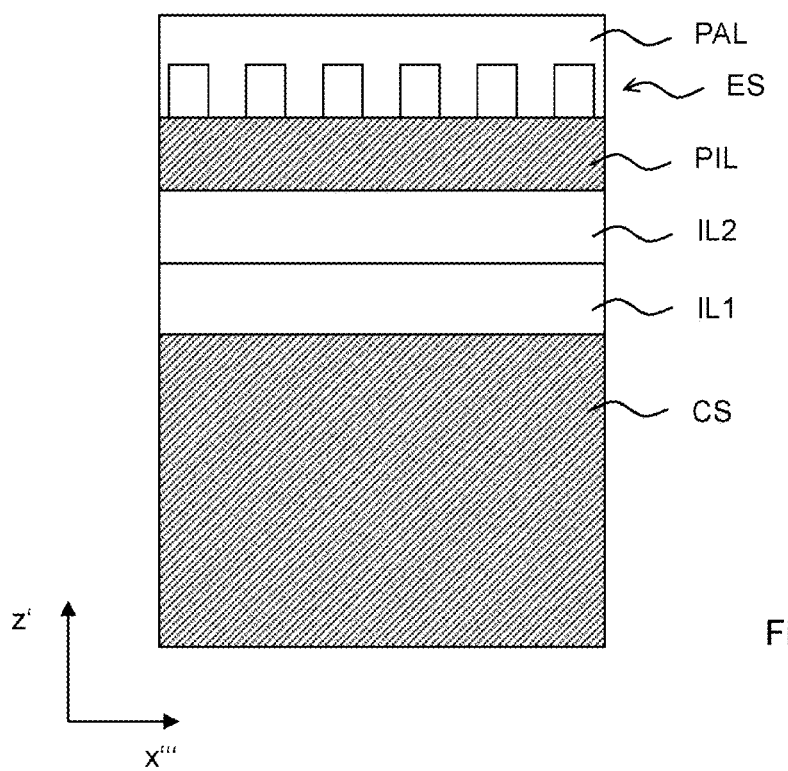
FIG. 3 shows a layer construction with a first and a second separation layer.

FIG. 3 indicates the possibility of arranging both the first $IL_1$ and the second $IL_2$ intermediate layer. The first intermediate layer $IL_1$ can be arranged between the second intermediate layer $IL_2$ and the carrier substrate. However, it is also possible that the order of the first and second intermediate layers is inverted.

Figure 4:
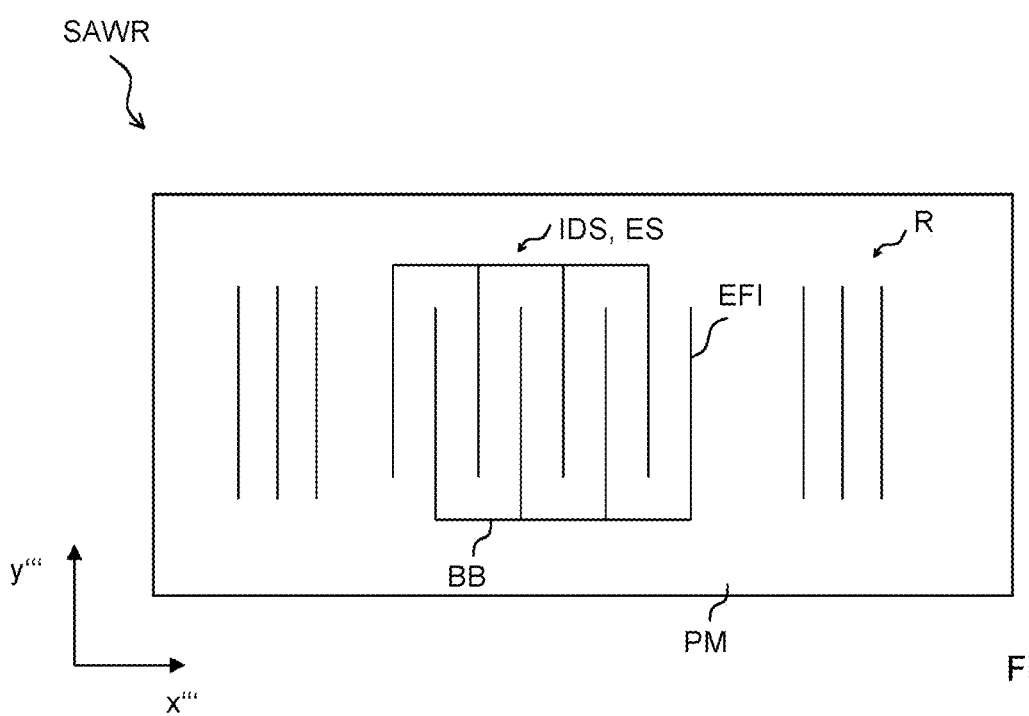
FIG. 4 shows—in a top view—a basic layout of the electrode structure.

FIG. 4 illustrates a basic configuration of a SAW resonator in a top view. The surface of the SAW resonator is parallel to the x'''-Y'''-plane. The direction of propagation of the acoustic waves is parallel to the longitudinal (x''') direction. The electrode fingers EFI have their extension along the y'''-direction. The busbars BB have an extension along the longitudinal direction x'''. Electrode fingers EFI are electrically connected to one of two busbars BB and establish interdigitated structures IDS. The interdigitated structures IDS establish the electrode structure ES and are arranged between acoustic reflectors R to confine acoustic energy in the acoustic track. The electrode structure ES together with the reflectors R are arranged on the piezoelectric material PM.

Figure 5:
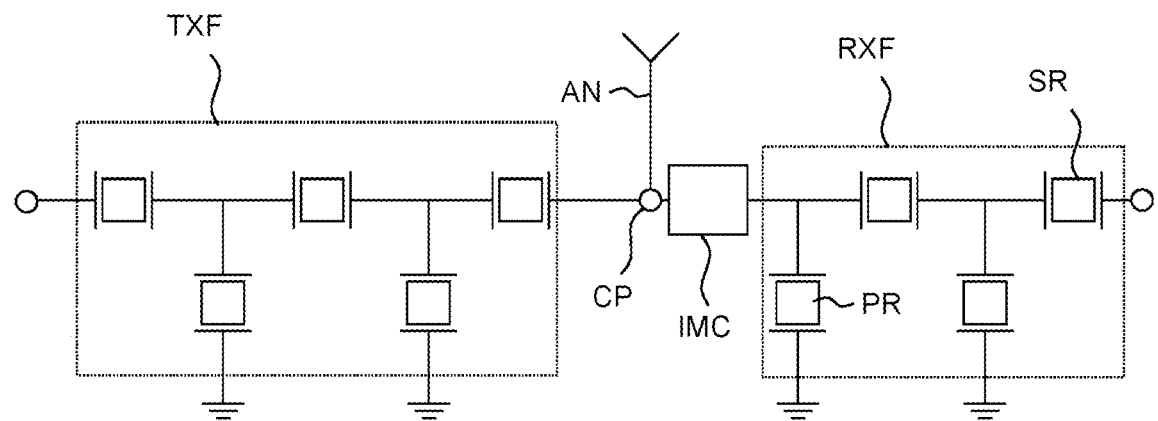
FIG. 5 illustrates possible circuit topologies of a duplexer.

FIG. 5 illustrates a possible circuit topology of a duplexer as an example of a multiplexer. The duplexer comprises a transmission filter TXF and a reception filter RXF. Each of the two filters has electro acoustic resonators, e.g. SAW resonators. The resonators can be series resonators SR electrically connected in series in a signal path. Parallel resonators PR electrically connect the signal path to ground. A common port CP can be electrically connected to an antenna AN. An impedance matching circuit IMC can be provided between the transmission filter TXF and the reception RXF to match input and output impedances of the filters in accordance with the corresponding frequencies.

FIG. 6 illustrates the definition of the Euler angles. The resulting axes x''', y''' and z''' correspond to the axes denoted by x, y, z in the figures above.

FIG. 7 illustrates a comparison of the real paths of admittance curves of two resonators. Curve 1 corresponds to a resonator where the silicon substrate has Euler angles (0°, 0°, 0°). Curve 2 corresponds to a resonator where the carrier substrate has the Euler angles (0°, 0°, 45°). It can clearly be seen that the orientation of the crystallographic axes of the carrier substrate substantially determines the performance of the resonator.

Correspondingly, FIG. 8 shows the frequency-dependent magnitudes of the admittance curves of the resonators corresponding to FIG. 7.

FIG. 9 shows the Euler angle μ dependence of the electroacoustic coupling coefficient $\kappa^2$. Specifically, the coefficient is increased when the Euler angle μ is decreased. The—when compared to conventional resonators—reduced angle μ would lead to an unwanted high coupling coefficient. The too high coupling coefficient would—in conventional resonators—be compensated by additional circuit components, e.g. for impedance matching. However, in the material and layer composition as described above an intrinsic compensation of the too high coupling coefficient can be obtained and the need for additional circuit components is reduced or even eliminated.

Similarly, FIG. 10 shows the Euler angle μ dependence of the temperature induced frequency drift ΔTCF. ΔTCF represents the difference in TCF between resonance and anti-resonance frequency of a resonator. This corresponds to a difference in TCF of left and right skirt of a filter.

FIG. 11 shows the real parts of the frequency dependent admittances of a conventional resonator (curve 1) showing a plurality of spikes associated with unwanted modes and of a resonator as described above (curve 1) with a much smoother course due to the reduction of unwanted modes.

Similarly, FIG. 12 shows the magnitudes of the frequency dependent admittances of the conventional resonator (curve 1) and of the resonator as described above (curve 1) with a much smoother course.

The resonator is not limited to the details and configurations shown above. Additional elements such as TCF layers, passivation layers, wave guiding elements and similar elements can be present. Despite the possibility of the presence of a plurality of additional layers—that would lead to potential sources of unwanted spurious modes—spurious modes are reduced and the performance is improved.

LIST OF REFERENCE SIGNS

AN: antenna
BB: busbar
CP: common port
CS: carrier substrate
EFI: electrode finger
ES: electrode structure
IDS: interdigitated structure
IMC: impedance matching circuit
PAL: passivation layer
PIL: piezoelectric layer
PM: piezoelectric material
PR: parallel resonator
R: acoustic reflector
RXF: reception filter
SAWR: SAW resonator
$IL_1$, $IL_2$: first, second intermediate layer
SR: series resonator
TXF: transmission filter

The invention claimed is:

1. A SAW resonator with reduced spurious modes, comprising
a carrier substrate,
an electrode structure above the carrier substrate,
a piezoelectric layer between the carrier substrate and the electrode structure, wherein
the carrier substrate has a crystal orientation with the Euler angles (−45°±10°; −54°=10°; 60°±30°),
the piezoelectric layer comprises $LiTaO_3$ and has a crystal orientation with the Euler angles (0°; 56°±8°; 0°).

2. The SAW resonator of claim 1, wherein
the carrier substrate has a crystal orientation with the Euler angles (−45°±5°; −54°±5°; 60°±10°) or (−45°±2°; −54°±5°; 60°±5°) or (−45°; −54°; 60°) and/or
the piezoelectric layer has a crystal orientation with the Euler angles (0°; 56°±4°; 0°), (0°; 56°±2°; 0°) or (0°; 56°; 0°).

3. The SAW resonator of claim 1, comprising a first intermediate layer
arranged between the carrier substrate and the piezoelectric layer,
having a thickness $t_{IL1}$ with $0.05\lambda \leq t_{IL1} \leq \lambda$ where λ is the wavelength of the acoustic main mode.

4. The SAW resonator of claim 3, wherein the first intermediate layer comprises a material selected from polycrystalline Si, an amorphous material, a dielectric material.

5. The SAW resonator of claim 1, comprising a second intermediate layer arranged between the carrier substrate and the piezoelectric layer, having a thickness $t_{IL2}$ with $0.05\lambda \leq t_{IL2} \leq 0.25\lambda$ where $\lambda$ is the wavelength of the acoustic main mode.

6. The SAW resonator of claim 5, wherein the second intermediate layer comprises a material selected from a silicon oxide and $SiO_2$.

7. The SAW resonator of claim 1, wherein the piezoelectric layer has a thickness $t_{PIL}$ with $0.1\lambda \leq t_{PIL} \leq 0.3\lambda$ where $\lambda$ is the wavelength of the acoustic main mode.

8. The SAW resonator of claim 1, wherein the electrode structure comprises Al, has a thickness $t_{EL}$ with $0.05\lambda \leq t_{EL} \leq 0.2\lambda$ where $\lambda$ is the wavelength of the acoustic main mode.

9. The SAW resonator of claim 1, further comprising a passivation layer arranged on or above the electrode structure and comprising $Si_3N_4$ and having a thickness $t_{PAL}$ with $0.0025\lambda \leq t_{PAL} \leq 0.05\lambda$ where $\lambda$ is the wavelength of the acoustic main mode.

10. The SAW resonator of claim 1, wherein the SAW resonator is part of an electroacoustic filter-.

11. The SAW resonator of claim 10, wherein the electroacoustic filter is part of a multiplexer for one or more CA applications.

* * * * *